United States Patent
Fan (10) Patent No.: US 8,420,437 B1
(45) Date of Patent: Apr. 16, 2013

(54) METHOD FOR FORMING AN EMI SHIELDING LAYER ON ALL SURFACES OF A SEMICONDUCTOR PACKAGE

(75) Inventor: Wen-Jeng Fan, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 10 days.

(21) Appl. No.: 13/311,063

(22) Filed: Dec. 5, 2011

(51) Int. Cl.
*H01L 9/00* (2006.01)
*H01L 21/00* (2006.01)

(52) U.S. Cl.
USPC .............. 438/78; 438/112; 438/124; 257/419

(58) Field of Classification Search ................... 438/127; 257/E21.506, 43, 419, 420, 433
See application file for complete search history.

(56) References Cited

U.S. PATENT DOCUMENTS

| | | | |
|---|---|---|---|
| 5,294,826 A | | 3/1994 | Marcantonio et al. |
| 5,559,306 A | * | 9/1996 | Mahulikar ..................... 174/538 |
| 6,365,960 B1 | | 4/2002 | Pollock et al. |
| 2001/0035571 A1 | * | 11/2001 | Corisis et al. ................. 257/678 |
| 2010/0207259 A1 | * | 8/2010 | Liao et al. ...................... 257/660 |
| 2010/0219423 A1 | * | 9/2010 | Nakata ............................ 257/88 |
| 2010/0224972 A1 | * | 9/2010 | Powell et al. ................. 257/676 |

* cited by examiner

*Primary Examiner* — Matthew Smith
*Assistant Examiner* — Wilner Jean Baptiste
(74) *Attorney, Agent, or Firm* — Muncy, Geissler, Olds & Lowe, PLLC (57) ABSTRACT

Disclosed is a method for forming an EMI shielding layer on all surfaces of a semiconductor package in order to enhance EMI shielding effect on all surfaces and to prevent electrical short to external terminals of the semiconductor package. According to the method, a temporary protective layer is formed on the external terminals where the temporary protective layer is further in contact with a plurality of annular surface regions of the semiconductor package surrounding and adjacent to the external terminals. Then, the EMI shielding layer is formed on the top surface, the bottom surface and the side surfaces of the semiconductor package without forming on the external terminals.

12 Claims, 7 Drawing Sheets

METHOD FOR FORMING AN EMI SHIELDING LAYER ON ALL SURFACES OF A SEMICONDUCTOR PACKAGE

FIELD OF THE INVENTION

The present invention relates to a manufacture method of a semiconductor device and more specifically to a method for forming an EMI shielding layer on all surfaces of an semiconductor package.

BACKGROUND OF THE INVENTION

Generally speaking, electrical-insulating packaging materials alias encapsulants are implemented to encapsulate IC chips inside semiconductor packages. As the development toward higher operation frequencies with smaller dimensions, IC chips are more vulnerable for EMI (electromagnetic interference) leading to signal transmission failure. Therefore, EMI shielding structures are often disposed inside semiconductor packages to avoid internal and external EMI. The existing EMI shielding structure can be divided into two major categories, one is EMI shielding sheets disposed inside semiconductor packages and encapsulated by the encapsulant as taught by Pollock et al. revealed in U.S. Pat. No. 6,365,960; the other is EMI shielding sheets or EMI shielding metal layers disposed on the top surface of the encapsulant as taught by Marcantonio et al. revealed in U.S. Pat. No. 5,294,826. However, the internally disposed EMI shielding sheets would have encapsulation issues and the externally disposed EMI shielding sheets/metal layers would have poor EMI shielding effects on the side surfaces and on the bottom surface of semiconductor packages and the issue of possible electrical short to external terminals.

SUMMARY OF THE INVENTION

The main purpose of the present invention is to provide a method for forming an EMI shielding layer on all surfaces of semiconductor packages to enhance EMI shielding to all surfaces of semiconductor packages and to avoid electrical short to external terminals of the semiconductor package.

According to the present invention, a method for forming an EMI shielding layer on all surfaces of semiconductor packages is revealed. Firstly, a semiconductor package is provided, comprising a chip, an encapsulant encapsulating the chip, and a plurality of external terminals exposed from the encapsulant where the semiconductor package has a top surface, a bottom surface, and a plurality of side surfaces between the top surface and the bottom surface. Then, a temporary protective layer is formed on a plurality of exposed surfaces of the external terminals and is further in contact with a plurality of annular surface regions of the semiconductor package surrounding and adjacent to the external terminals. Then, an EMI shielding layer is formed on the top surface, the bottom surface, and those side surfaces of the semiconductor package without disposed on the exposed surfaces of the external terminals. Preferably, the temporary protective layer is removed by heating after forming the EMI shielding layer.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
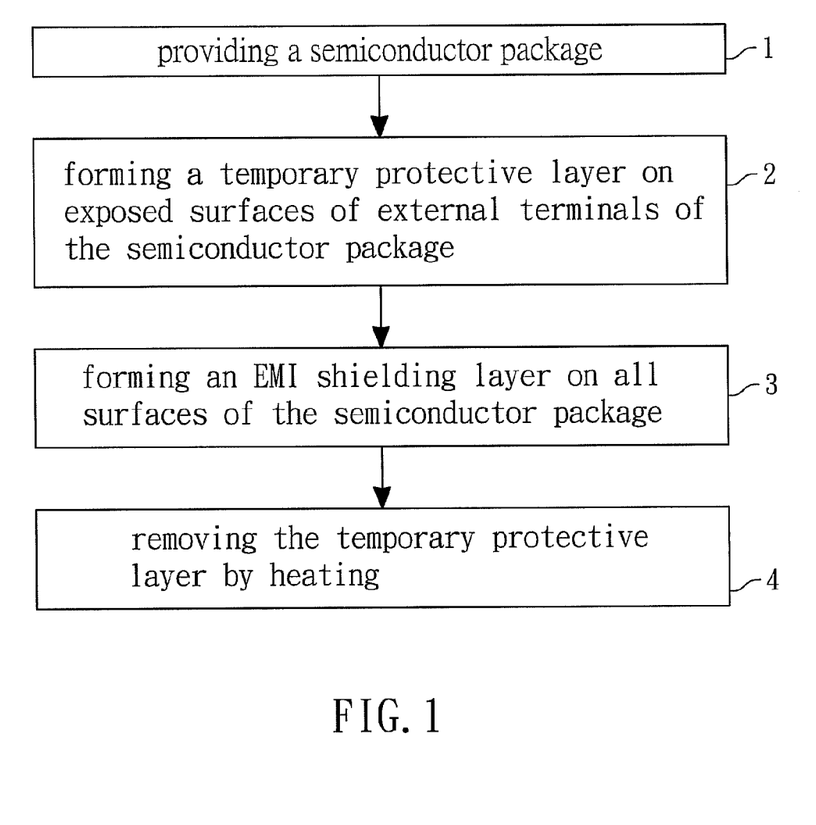
FIG. 1 is a process flow of the method for forming an EMI shielding layer on all surfaces of semiconductor packages according to the preferred embodiment of the present invention.

According to the first embodiment of the present invention, a method for forming an EMI shielding layer on all surfaces of semiconductor packages is illustrating in FIG. 1 for a process flow, in FIGS. 2A to 2D for component cross-sectional views illustrating the major processing steps. According to the process flow of FIG. 1, the method of the present invention primarily comprises step 1 of providing a semiconductor package, step 2 of forming a temporary protective layer on exposed surfaces of external terminals of the semiconductor package, step 3 of forming an EMI shielding layer on all surfaces of the semiconductor package, and an optional step 4 of removing the temporary protective layer by heating after step 3.

Figure 2A:
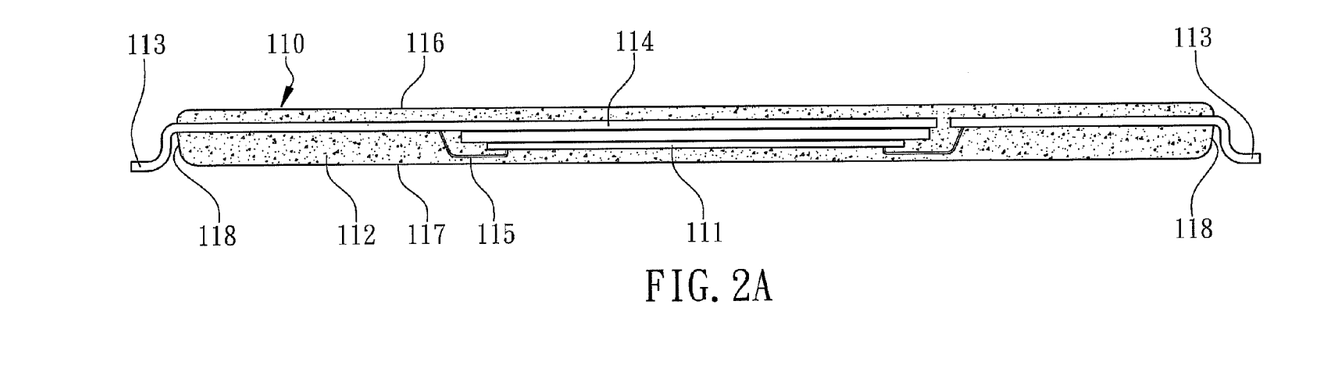
FIGS. 2A to 2D are component cross-sectional views illustrating the major processing steps of the method for forming an EMI shielding layer on all surfaces of semiconductor packages according to the first embodiment of the present invention.

Firstly, in the present embodiment, step 1 as referred to FIG. 2A, a semiconductor package 110 is provided. The semiconductor package 110 comprises a chip 111, an encapsulant 112 encapsulating the chip 111, and a plurality of external terminals 113 exposed from the encapsulant 112 where the semiconductor package 110 has a top surface 116, a bottom surface 117, and a plurality of side surfaces 118. The top surface 116 is the surface of the semiconductor package 110 where product marking can be done on the top surface 116, the bottom surface 117 is the surface of the semiconductor package 110 toward a mounted external PCB when SMD mounting the semiconductor package 110, and the side surfaces 118 are formed between the top surface 116 and the bottom surface 117. Normally, the top surface 116, the bottom surface 117 and the side surfaces 118 are electrically insulating surfaces formed from semiconductor packaging materials such as EMC (epoxy molding compound) or solder mask of substrate. The chip 111 has an active device on which all necessary IC circuitry such as memory or controller are formed where the number of chips 111 can be one or plural. In the present embodiment, the external terminals 113 can include a plurality of outer leads of a leadframe as the external terminals for the semiconductor package 110 where the outer leads are extended from the side surfaces 118 and bent toward the bottom surface 117. The leadframe further has a plurality of inner leads 114 encapsulated by the encapsulant 112 and integrally connected to the outer leads. The chip 111 is carried by and adhered to the inner leads 114 by adhesives disposed on the backside of the chip 111. In different embodiment, the chip 111 can also be carried on at least a die pad of the leadframe. As shown in FIG. 2A again, the chip 111 is attached to the inner leads 114 to gain physical support and is electrically connected to the inner leads 114 by a plurality of bonding wires 115 or by other electrical connecting components. The encapsulant 112 is an insulating material formed by molding to encapsulate the chip 111. Furthermore, the top surface 116, the bottom surface 117, and the side surfaces 118 of the semiconductor package 110 are all formed by the encapsulant 112.

Figure 2B:
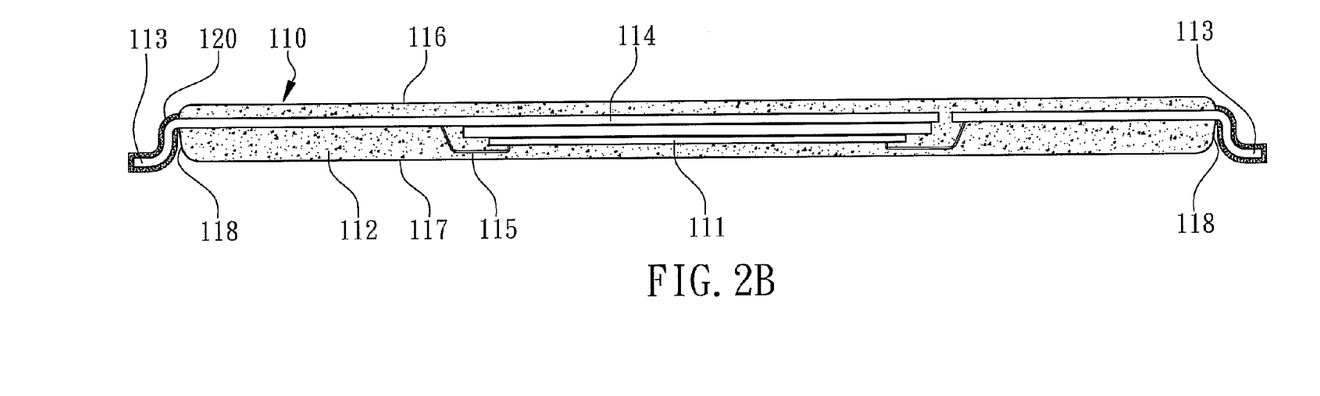
Figure 2D:
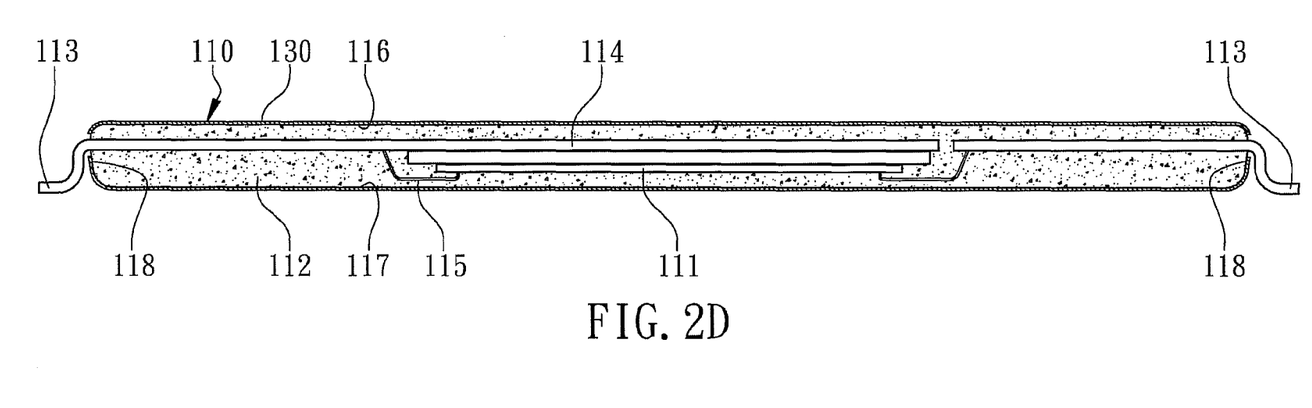
Figure 3:
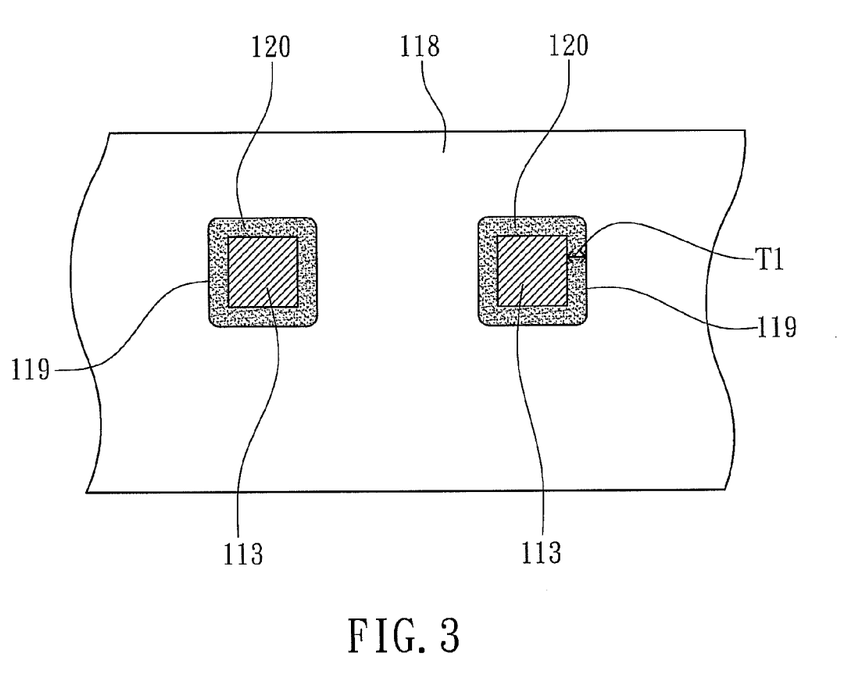
FIG. 3 is a partially sectional side view of the semiconductor package after forming the temporary protective layer according to the first embodiment of the present invention.

Then, step 2 as shown in FIG. 2B, a temporary protective layer 120 is formed on a plurality of exposed surfaces of the external terminals 113 where the exposed surfaces are exposed metal surfaces. Moreover, the temporary protective layer 120 is further in contact with a plurality of annular surface regions 119 of the semiconductor package 110 surrounding and adjacent to the external terminals 113 of the semiconductor package 110 (as shown in FIG. 3). In the present embodiment, the annular surface regions 119 are the surface regions of the side surfaces 118 having the shapes of rectangle rings to surround the external terminals 113. As shown in FIG. 3, preferably, the temporary protective layer 120 has a thickness T1 to define the width of the annular surface regions 119 so that the EMI shielding layer 130 doesn't electrically contact the external terminals 113 as shown in FIG. 2D. The thickness T1 of the temporary layer 120 ranges from 0.01 um (micrometer) to 0.5 um which may be greater than the thickness of the EMI shielding layer 130. Preferably, the temporary protective layer 120 is an organic solderability preservative (OSP) to form by chemical methods and to dispose only on the metal surfaces of the external terminals 113 without disposing on the insulating surfaces of the encapsulant 112 where the temporary protective layer 120 can easily be cleaned during processes. The temporary protective layer 120 can be formed by dipping or by patterned spraying.

Figure 2C:
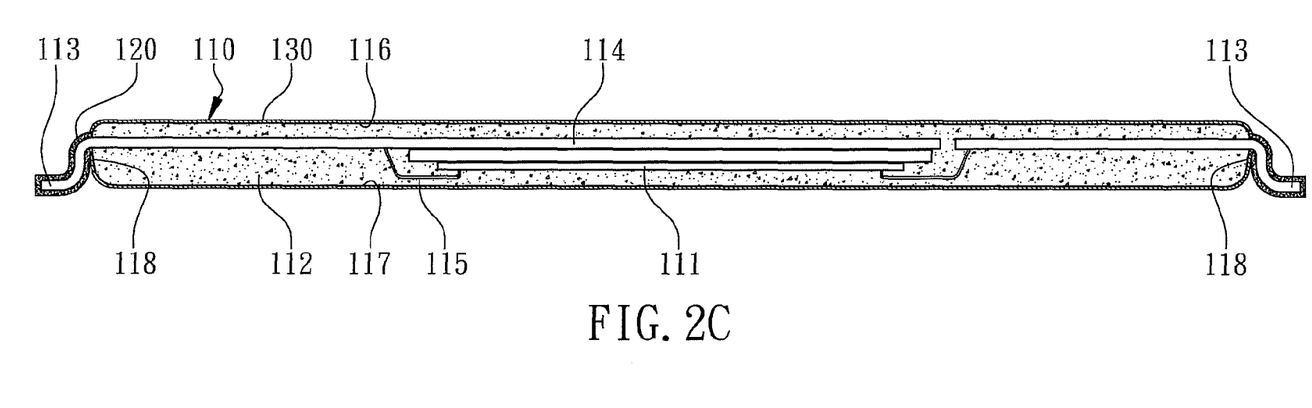

Then, step 3 as shown in FIG. 2C, an EMI shielding layer 130 is disposed on the top surface 116, on the bottom surface 117, and on the side surfaces 118 of the semiconductor package 110 without disposing on the exposed surfaces of the external terminals 113. The EMI shielding layer 130 has the characteristic of shielding EMI effects where the EMI shielding layer 130 is a conductive material such as silver, aluminum, conductive carbon black, conductive polymer formed by mixing resins with conductive particles, silver-copper conductive paste, or composite materials formed by known conductive materials. The thickness of the EMI shielding layer 130 ranges from 0.1 um to 100 um where the EMI shielding layer 130 can be formed by *coating, spraying, dipping, etc.* T*herefore*, the EMI shielding coverage of the EMI shielding layer 130 is much better than *the* conventional EMI shielding *sheet/layer* disposed inside the encapsulant 112 or *adhered* to one single surface of the encapsulant 112 without affecting the solderability of *the* external terminals 113.

Therefore, the method for forming an EMI shielding layer on all surfaces of semiconductor packages of the present invention can enhance EMI shielding to all surfaces of semiconductor packages and to avoid electrical short to external terminals of semiconductor packages.

Furthermore, an optional step four can be further executed as shown in FIG. 2D, the method of the present invention further comprises the step of removing the temporary protective layer 120 by heating where an additional benefit of the present processing step is to further enhance the adhesion of the EMI shielding layer 130 to the encapsulant 120. Moreover, when the temporary protective layer 120 is an organic protective layer, the above described step of removing the temporary protective layer 120 further includes using flux under heating to clean the exposed surfaces of the external terminals 113 and also to thoroughly and quickly remove the temporary protective layer 120.

According to the second embodiment of the present invention, another method for forming an EMI shielding layer on all surfaces of semiconductor packages is illustrated in FIG. 1 for a process flow and in FIGS. 4A to 4D for component cross-sectional views the major processing steps. The second embodiment of the present invention can be implemented in different kinds of semiconductor packages.

Figure 4A:
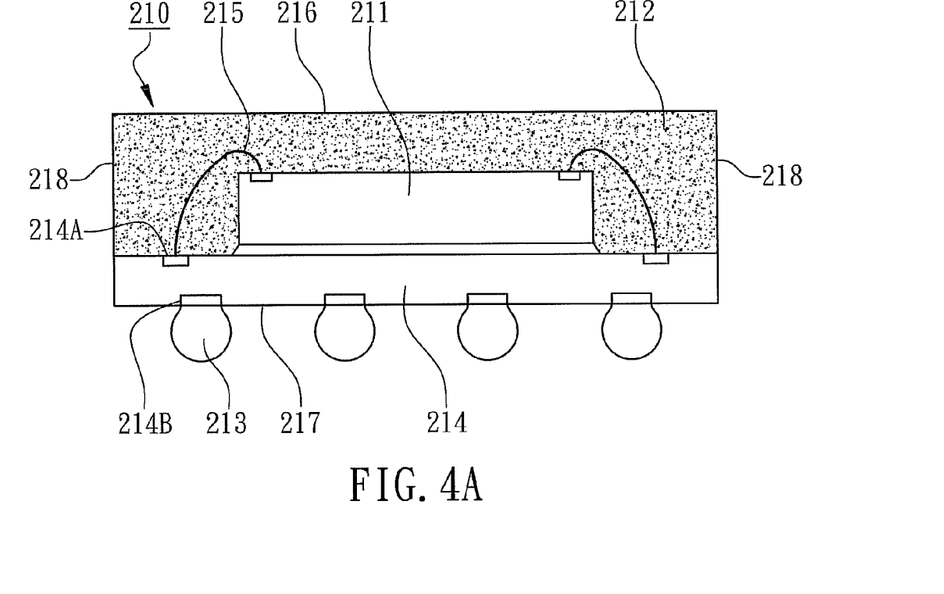
FIGS. 4A to 4D are component cross-sectional views illustrating the major processing steps of another method for forming an EMI shielding layer on all surfaces of semiconductor packages according to the second embodiment of the present invention.
Figure 4B:
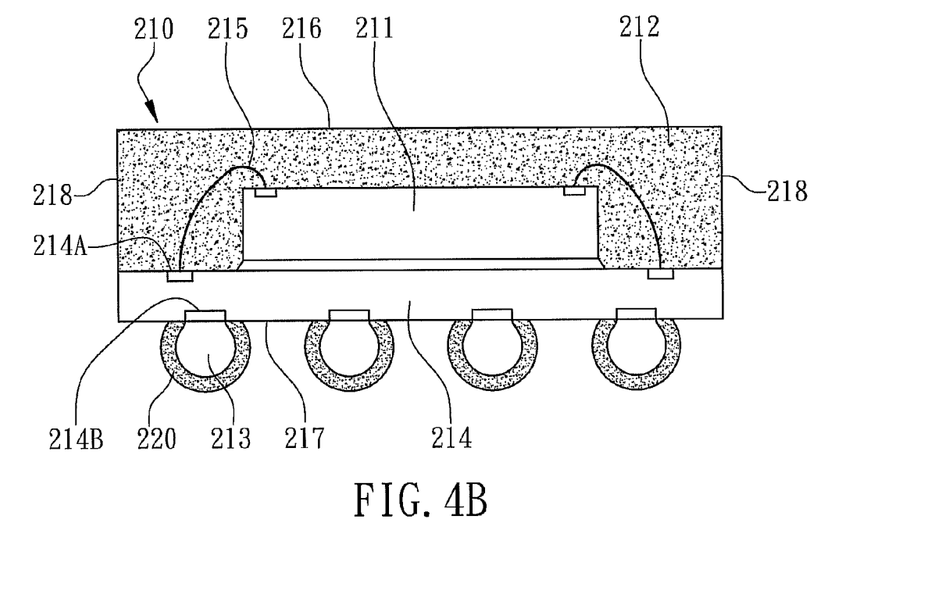
Figure 4C:
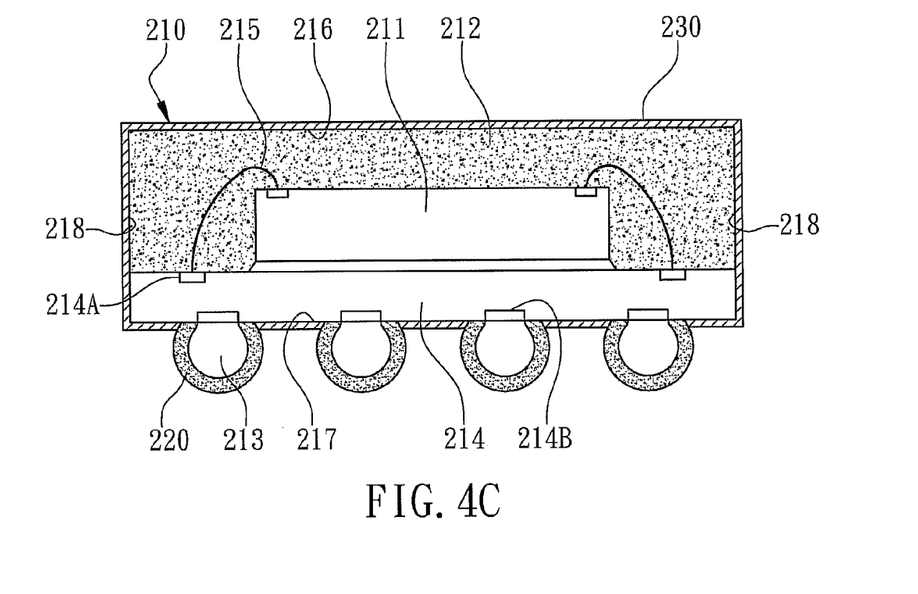
Figure 4D:
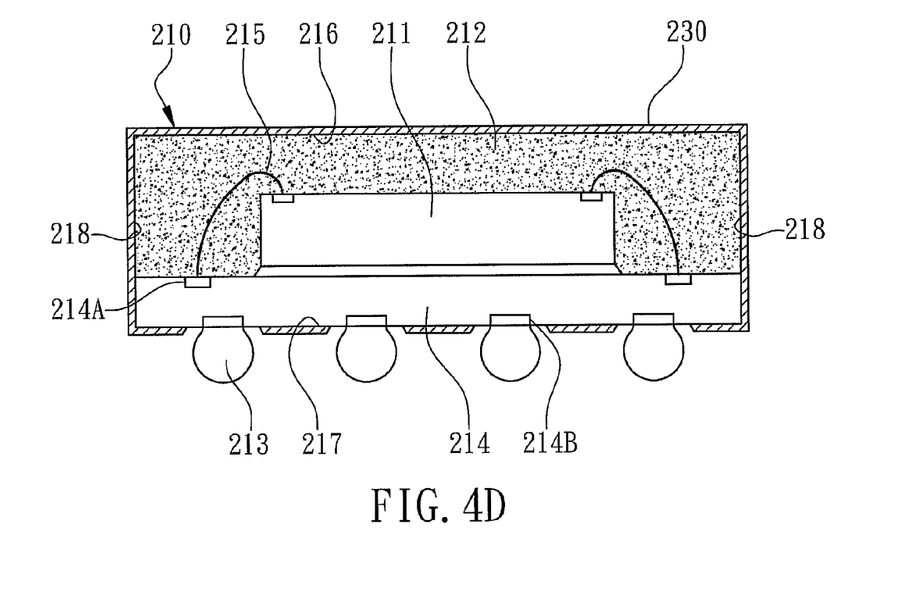
Figure 5:
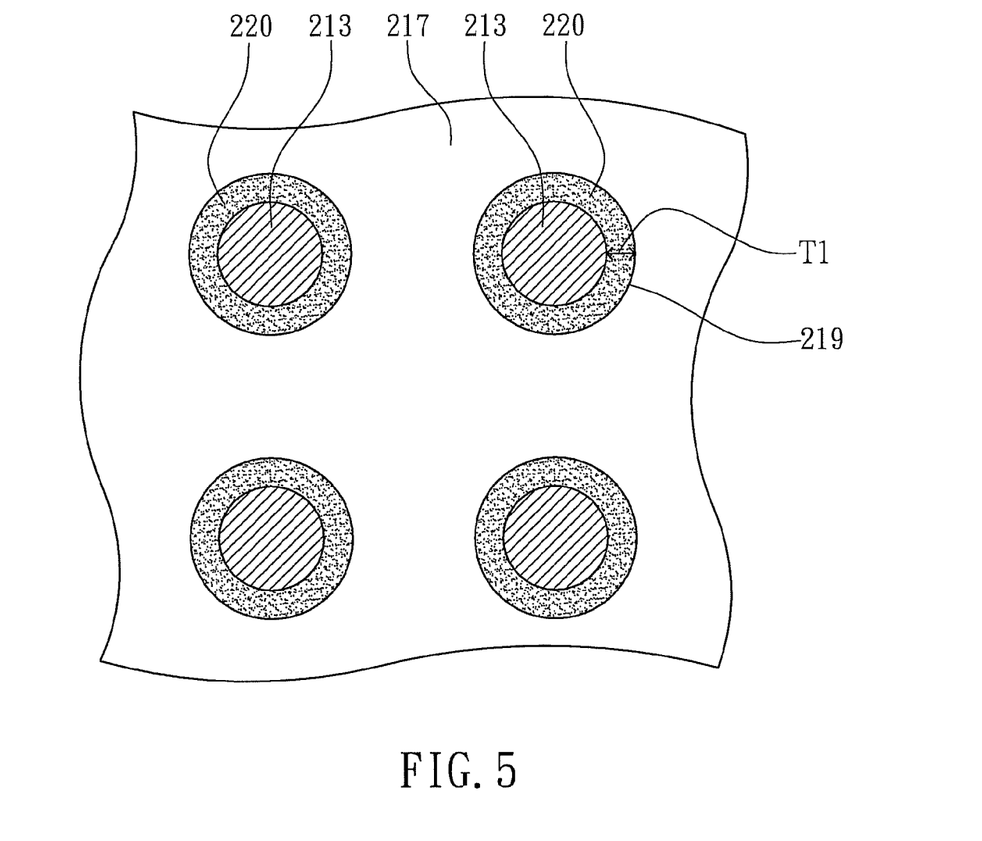
FIG. 5 is a partially sectional bottom view of the semiconductor package after forming the temporary protective layer according to the second embodiment of the present invention.

Firstly, in the present embodiment, step 1 as shown in FIG. 4A, a semiconductor package 210 is provided, comprising a chip 211, an encapsulant 212 to encapsulate the chip 211, and a plurality of external terminals 213 exposed from the encapsulant 212 where the semiconductor package 210 has a top surface 216, a bottom surface 217, and a plurality of side surfaces 218 between the top surface 216 and the bottom surface 217. In the present embodiment, the external terminals 213 include a plurality of solder balls disposed on the bottom surface 217 of the semiconductor package 210. The semiconductor package 210 further comprises a substrate 214 on which the chip 211 is disposed. As shown in FIG. 4A again, the chip 211 is attached to the substrate 214 to gain physical support and is electrically connected to the bonding fingers 214A of the substrate 214 by a plurality of bonding wires 215 or by other electrical connecting components. In the present embodiment, the top surface 216 and most of the side surfaces 218 are formed by the encapsulant 212. The bottom surface 217 of the semiconductor package 210 is formed by the substrate 214 where the bottom surface 217 is the SMT surface of the semiconductor package 210, i.e., the disposed surface of the solder balls 213. A plurality of ball pads 214B are disposed on the bottom surface 217 for the joint of the external terminals 213. Then, step 2 as shown in FIG. 4B, a temporary protective layer 220 is formed on the exposed surfaces of the external terminals 213 where the exposed surfaces are exposed metal surfaces of the solder balls. Moreover, the temporary protective layer 220 is further in contact with the annular surface regions 219 (as shown in FIG. 5) adjacent to the external terminals 213 of the semiconductor package 210. In the present embodiment, the annular surface regions 219 are the surface regions of the bottom surface 217 having the shapes of circular rings to surround the external terminals 213. As shown in FIG. 5, preferably, the temporary protective layer 220 has a thickness T1 to define the width of the annular surface regions 219 so that the EMI shielding layer 230 doesn't electrically contact the external terminals 213 as shown in FIG. 4D. Then, step 3 as shown in FIG. 4C, an EMI shielding layer 230 is disposed on the top surface 216, on the bottom surface 217, and on the side surfaces 218 of the semiconductor package 210 without disposing on the exposed surfaces of the external terminals 213.

Furthermore, an optional step 4 can be further executed as shown in FIG. 4D, the method of the present invention further comprises the step of removing the temporary protective layer 220 by heating where an additional benefit of the present processing step is to further enhance the adhesion of the EMI shielding layer 130 to the encapsulant 120. Moreover, when the temporary protective layer 220 is an organic protective layer, the above described step of removing the temporary protective layer 220 by heating further includes using flux under heating to clean the exposed surfaces of the external terminals 213 and to thoroughly and quickly remove the temporary protective layer 220. Therefore, the EMI shielding coverage of the EMI shielding layer 230 is much better the conventional EMI shielding sheet/layer disposed inside the encapsulant 212 or adhered to one single surface of the encapsulant 212 without affecting the solderability of the external terminals 213. The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method for forming an EMI shielding layer on all surfaces of a semiconductor package, comprising the steps of:
   providing a semiconductor package comprising a chip, an encapsulant encapsulating the chip, and a plurality of external terminals exposed from the encapsulant, wherein the semiconductor package has a top surface, a bottom surface, and a plurality of side surfaces;
   forming a temporary protective layer on a plurality of exposed surfaces of the external terminals, wherein the temporary protective layer is further in contact with a plurality of annular surface regions of the semiconductor package surrounding and adjacent to the external terminals;
   forming an EMI shielding layer on the top surface, the bottom surface, and the side surfaces without forming on the exposed surfaces of the external terminals; and
   removing the temporary protective layer to create a gap between the EMI shielding layer and the external terminals wherein the gap is defined by the thickness of the temporary protective layer.

2. The method as claimed in claim 1, wherein the temporary protective layer has a thickness to define the width of the annular surface regions so that the EMI shielding layer doesn't electrically contact the external terminals.

3. The method as claimed in claim 2, further comprising the step of wherein said removing the temporary protective layer comprises removing the temporary protective layer by heating after forming the EMI shielding layer.

4. The method as claimed in claim 3, wherein the thickness of the temporary layer is greater than the thickness of the EMI shielding layer.

5. The method as claimed in claim 3, wherein the temporary protective layer is an organic solderability preservative (OSP) and the step of removing the temporary protective layer further includes using flux under heating to clean the exposed surfaces of the external terminals.

6. The method as claimed in claim 1, wherein the external terminals include a plurality of outer leads of a leadframe.

7. The method as claimed in claim 6, wherein the outer leads are extended from the side surfaces of the semiconductor package.

8. The method as claimed in claim 6, wherein the top surface, the bottom surface, and the side surfaces of the semiconductor package are all formed by the encapsulant.

9. The method as claimed in claim 7, wherein the leadframe further has a plurality of inner leads encapsulated by the encapsulant and integrally connected to the outer leads, wherein the chip is carried by the inner leads.

10. The method as claimed in claim 1, wherein the external terminals include a plurality of solder balls disposed on the bottom surface of the semiconductor package.

11. The method as claimed in claim 10, wherein the semiconductor package further comprises a substrate on which the chip is disposed.

12. The method as claimed in claim 11, wherein the top surface and most of the side surfaces of the semiconductor package are formed by the encapsulant and the bottom surface of the semiconductor package is formed by the substrate.

* * * * *